United States Patent [19]

Vanstraelen

[11] Patent Number: 5,224,133
[45] Date of Patent: Jun. 29, 1993

[54] MODULAR HIGH SPEED COUNTER EMPLOYING EDGE-TRIGGERED CODE

[75] Inventor: Guy F. Vanstraelen, DeSoto, Tex.

[73] Assignee: Universities Research Association, Inc., Washington, D.C.

[21] Appl. No.: 847,912

[22] Filed: Mar. 6, 1992

[51] Int. Cl.[5] .............................................. H03K 21/34
[52] U.S. Cl. ........................................ 377/51; 377/47; 377/118
[58] Field of Search ............................ 377/51, 47, 118

[56] References Cited

U.S. PATENT DOCUMENTS

| | | | |
|---|---|---|---|
| 3,862,440 | 1/1975 | Suzuki et al. | 307/266 |
| 4,214,173 | 7/1980 | Popper | 377/117 |
| 4,513,432 | 4/1985 | Gulati | 377/121 |
| 4,700,370 | 10/1987 | Banerjee et al. | 377/55 |
| 4,741,004 | 4/1988 | Kane | 377/110 |
| 4,759,043 | 7/1988 | Lewis | 377/117 |
| 4,786,861 | 11/1988 | Hulsing, II et al. | 324/78 |
| 4,924,484 | 5/1990 | Grasso et al. | 377/116 |
| 4,974,241 | 11/1990 | McClure et al. | 377/116 |
| 5,062,126 | 10/1991 | Radys | 377/51 |

OTHER PUBLICATIONS

"Introduction of MOS LSI Design"; Authors: J. Mavor, M. A. Jack, P. B. Denyer; Publisher: Addison-Wesley Publishing Co.

*Primary Examiner*—William L. Sikes
*Assistant Examiner*—Scott A. Ouellette
*Attorney, Agent, or Firm*—Hubbard, Thurman, Tucker & Harris

[57] ABSTRACT

A high speed modular counter (100) utilizing a novel counting method in which the first bit changes with the frequency of the driving clock, and changes in the higher order bits are initiated one clock pulse after a "0" to "1" transition of the next lower order bit. This allows all carries to be known one clock period in advance of a bit change. The present counter is modular and utilizes two types of standard counter cells. A first counter cell determines the zero bit. The second counter cell determines any other higher order bit. Additional second counter cells are added to the counter to accommodate any count length without affecting speed.

10 Claims, 3 Drawing Sheets

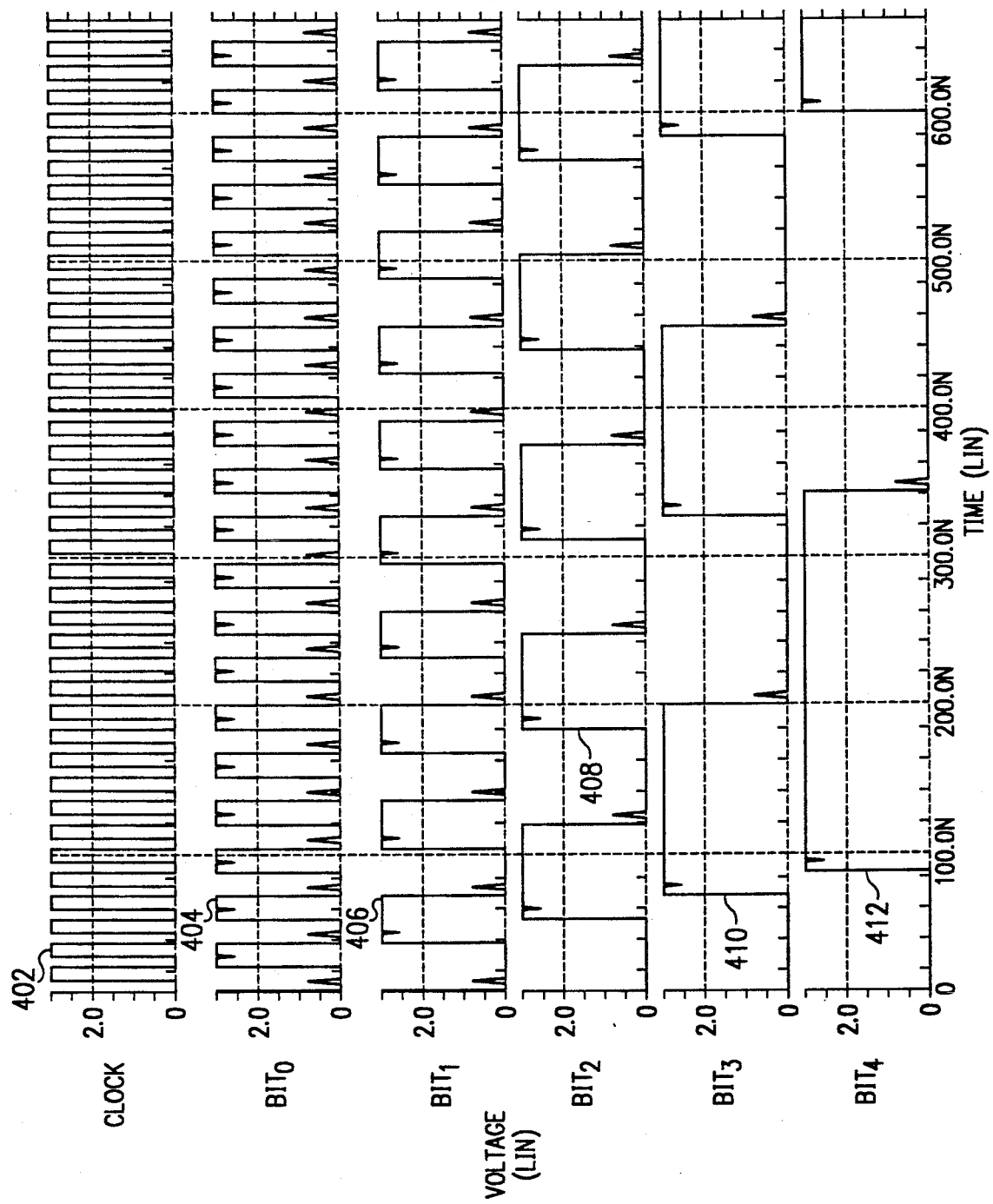

MODULAR HIGH SPEED COUNTER EMPLOYING EDGE-TRIGGERED CODE

This invention was made with Government support under contract No. DE-AC02-89ER40486 between Universities Research Association, Inc. and the Department of Energy. The Government has certain rights in this invention.

TECHNICAL FIELD OF THE INVENTION

The present invention relates to a high speed modular counter. Particularly, the present invention utilizes a counter and a counting method wherein the first bit changes with the frequency of the driving clock, and changes in each of the higher order bits are initiated solely by a transition of the next lower order bit on the previous count.

BACKGROUND OF THE INVENTION

Most counters follow well-known standard binary counting procedures in which each next higher order bit changes from a "0" to a "1" only after all binary variations of the lower order bits have been used. When this occurs, there is a ripple of bit changes from the lowest order bit through the higher order bits which follows propagation of a "carry" bit through the counter. The delay occasioned by the propagation of the carry is a serious impediment to the operational speed of counters used in high-speed applications, such as in nuclear reaction counting procedures where speeds of $10^8$ counts per second or greater are needed.

Designers of binary counters have attempted to address the speed problem by adding special circuitry to enhance the counting process. Various design modifications have been applied to all types of counters, including divide-by-N counters, ripple counters, and synchronous counters.

A divide-by-N counter can count to a given number N. It is continuously clocked and allowed to recycle or rollover to 0 after reaching the Nth count. If the output is taken from the most significant stage of the counter, it provides a pulse that is N times as long as the original clock pulse. The frequency of this output is equal to the frequency of the original clock divided by N.

An example of a divide-by-N counter which has additional circuitry to enhance its speed is shown in U.S. Pat. No. 4,741,004 to Kane entitled "High-Speed Programmable Divide-By-N Counter". Kane '004 employs a plurality of speed enhancement techniques to provide an overall operation corresponding to the speed at which a single-clocked flip-flop is capable of being toggled.

In a ripple counter, the clock ripples through the counter stage by stage, with the output of a lower order stage being provided to the clock of a higher order stage. There must be sufficient time for the clock to ripple through each stage plus any additional gating and decoding time before the next clock pulse can occur. Therefore, the speed of ripple counters is severely limited. Look ahead circuits comprising AND or NAND gates have been used in order to decrease this carry ripple time. However such NAND gates have required a significant amount of die area as the number of counter stages increases. Moreover, this increase in the number of gates which reduces the counting rate.

Synchronous counters are often used to reduce the time delay and glitch problems associated with ripple counters. A synchronous counter has one common clock that is connected to all flip-flop or counter cells. Hence, all flip-flop change at the clock rate regardless of the number of stages. With all stages changing together, glitches are greatly reduced because of the shorter transition time interval. Nevertheless, the clock rate of synchronous counters of the prior art is limited considerably, particular in counters having long word lengths. Each stage must wait to receive a carry from the next lower order bit. The carry, which starts with the lowest order bit, ripples like the clock in the ripple counter through each counter stage. The highest order bit on the counter cannot take on its final value until it receives a carry. In counters with long word lengths, the delay caused by the ripple or propagation of the carry severely limits the speed of the counters.

Modifications to boost speed, such as carry lookahead circuitry, have been employed in prior art counters. However, with such schemes there is an exponential increase in the number of logic gates required with each additional bit which introduces limits on speed as well as limits on size. In practical applications, use of such circuitry tends to be limited in the number of bits to around five. Furthermore, the layout or design of synchronous counters tend to be complicated, as the structure of high order bit stages are dependent on all next lower order bit cells. This makes it difficult to extend the length of the counter by simply adding additional counters or counting cells.

SUMMARY OF THE INVENTION

The present invention concerns a counter in which there is no rippling through of clock or carry information. It is ideal for very high speeds because each cell of the counter is dependent only on the next lower order bit cell, except for the lowest order bit cell which depends only on the clock signal. Extending the size of the counter is therefore a straightforward task, and no additional circuitry schemes to boost speed are required.

The counter of the present invention utilizes a counting method wherein the first bit changes are only determined by the frequency of the driving clock, and changes in the higher order bits are initiated solely by a transition of the next lower order bit in the previous counting step. The state of each counter cell is therefore independent of all other counter cells except for the one representing the next immediately lower order bit.

In one preferred embodiment, the higher order bit changes are initiated by a "0" to "1" transition of the next lower order bit in the previous counting step. This counting method results in a unique counting code illustrated by the following comparison:

| Binary Code | Decimal Numerals | Edge Triggered Code |
|---|---|---|
| 000 | 0 | 000 |
| 001 | 1 | 001 |
| 010 | 2 | 010 |
| 011 | 3 | 111 |
| 100 | 4 | 100 |
| 101 | 5 | 101 |
| 110 | 6 | 110 |
| 111 | 7 | 011 |

In this method, the first bit is driven by the clock, with its output changing at $\frac{1}{2}$ the clock rate, while the second bit and each higher order bit is changed by a "0" to "1" transition of the next lower order bit in the previous counting step. There is no carry, and all bit changes are known one clock period in advance. The count may be converted, if desired, to the corresponding binary code.

In one preferred embodiment, the counter cell includes: a latch circuit to retain the previous bit value of the cell; a circuit for detecting a "0" to "1" transition within the bit cell and providing a flag signal to a next higher bit indicating detection of the transition; and a circuit for generating the next bit value of the cell based on its present bit value and the flag signal from a next lower order bit. The lowest order bit cell is driven only by the clock signal and therefore its circuitry is simplified.

A counter having any number of bits may be constructed by connecting together one cell for each bit and may be further extended by adding on additional cells without affecting the speed of the counter.

BRIEF DESCRIPTION OF THE DRAWINGS

The preferred embodiment of the invention, demonstrating the foregoing and further features and advantages of the present invention is described below in connection with the appended drawings which form a part of the disclosure, wherein:

FIG. 4 is a graph of a computer simulation showing the voltage level of the output of each counter cell of a six bit counter constructed using the circuits of FIGS. 2 and 3 versus time using a clock signal with a frequency of 100 megahertz (MHz).

DETAILED DESCRIPTION OF THE DRAWINGS

Figure 1:
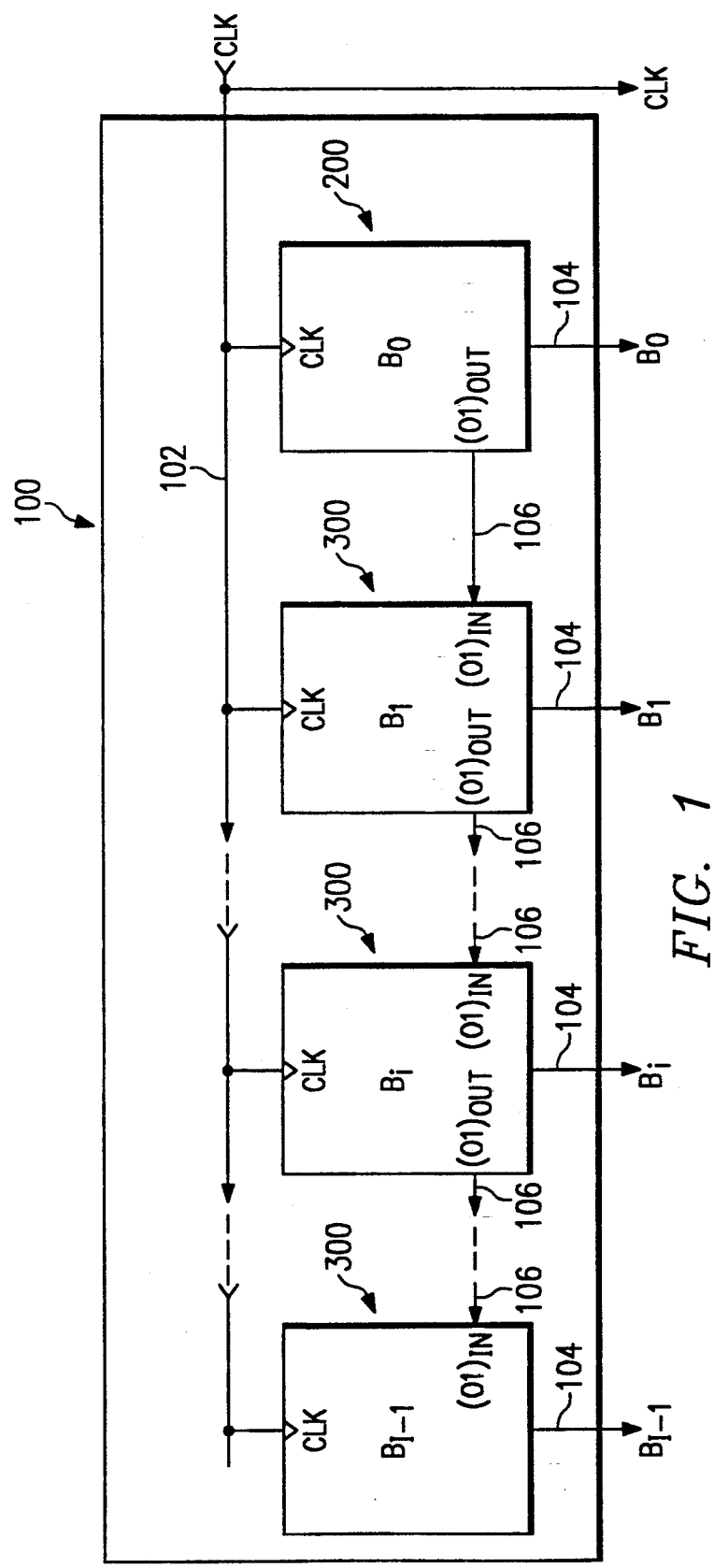
FIG. 1 schematically illustrates at a block level a counter having I number of bits, composed of a $B_0$ cell and $I-1$ standard $B_i$ cells.

Referring to FIG. 1, counter apparatus 100 is comprised of a first counter cell 200 and at least one second counter cell 300. The modular design of counter 100 permits it to be enlarged to handle any count length with additional second counter cells 300. The counter cells are configured in a cascade architecture to create a counter that counts to $2^I - 1$. To do so requires I number of bits, $B_0$ to $B_{I-1}$, that assume the binary values of "0" or "1". All bits values are represented by logic level voltage signals. For purposes of discussion of the counter circuits at their gate level, "bit" will refer to both a binary value ("0" or "1") as well as to the signal that represents or carries it.

The first counter cell 200 is used only to count the lowest order bit, the $B_0$ bit. The remaining bits $B_i$, from $i=1$ to $I-1$, are counted by second counter cells 300. Each counter cell 200 and 300 is provided the same clock signal on line 102.

Each counter cell 200 and 300 has an output line 104 for carrying the counter cell's bit value $B_i$, $i=0$ to $I-1$, to a circuit or system (not shown) in which the counter is placed. Each counter cell 300 utilizes the occurrence of a "0" to "1" transition in the value held by the next lower order bit cell during a previous clock period to change its own value during the current clock period.

The counter cells 200 and 300 are connected together serially with a line 106 running between each lower order bit cell $B_i$ to a next higher order bit cell $B_{i+1}$. Each line carries a (01) logic level signal that acts as a "flag" and is not a carry. The (01) signal is generated by the lower order bit cell and indicates by going to a logic level "1" that a transition from "0" to "1" in the lower order bit has occurred. In other words, the flag acts as an enable signal. The (01) signal from a lower order bit will be referred to as $(01)_{out}$, and when it is received by a next higher order bit cell it will be referred to as $(01)_{in}$. The counter cell 200 for the $B_0$ bit does not have a $(01)_{in}$ input, as its value $B_0$ depends only on the clock signal on line 102 and not on a transition from a lower order bit cell.

The output value $B_i$ of each cell at clock cycle "v" is governed by the same rule, given by the following boolean expression:

$$B_i^{v+1} = B_i'^v(B_{i-1}^v B_{i-1}^{v-1}) + B_i^v(B_{i-1}^v B_{i-1}^{v-1})$$

which can be rewritten as, $$B_i^{v+1} = B_i^v \oplus (B_{i-1}^v + B_{i-1}^{v-1})$$

The portion enclosed in the brackets indicates the logic value represented of the $(01)_{in}$ signal. In counter cell 200, $(01)_{in}$ always remains at a value of "1". The rule is therefore simplified for counter cell 200.

Figure 2:
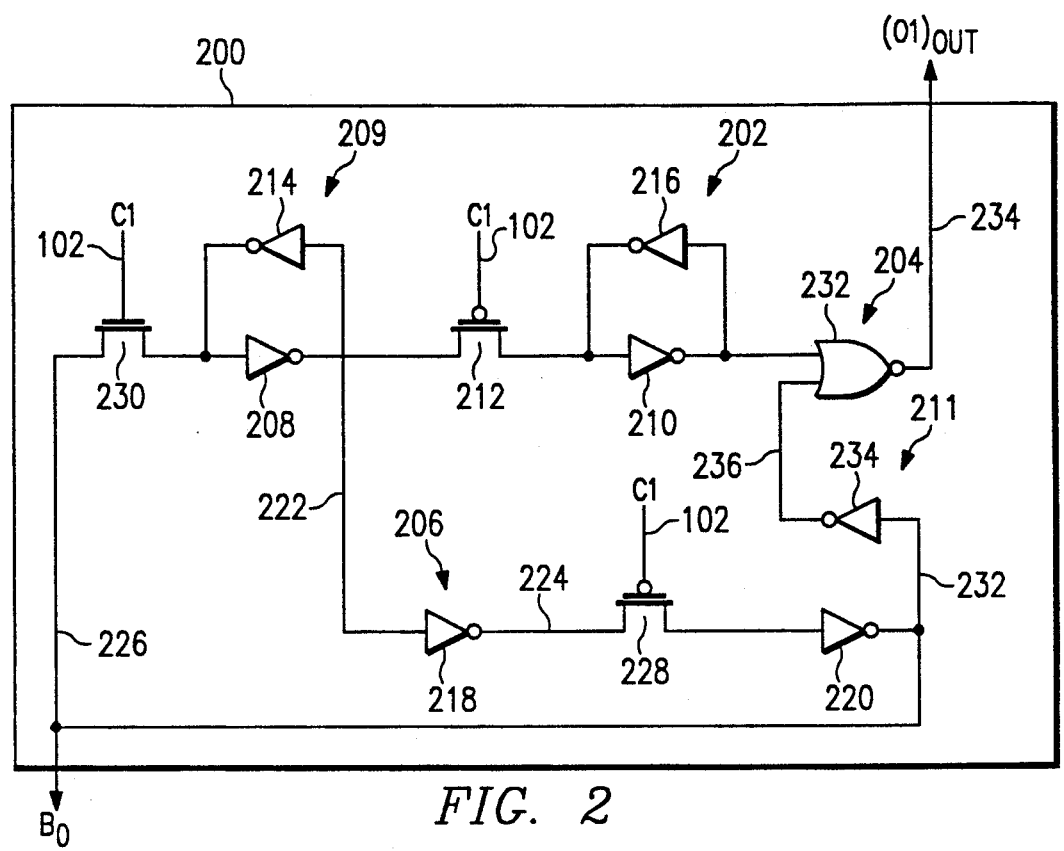
FIG. 2 is gate-level schematic diagram of $B_0$ cell.

FIG. 2 shows a gate-level schematic diagram of a circuit for implementing counter cell 200, used for the lowest order bit $B_0$ according to the rule expressed above. In essence it includes a latch portion 202, a transition detection portion 204 and a next bit value generation portion.

The latch portion 202 remembers a value of bit $B_0$ during an immediately previous clock cycle. This value will be notated $(B_0)^{v-1}$, where "v" indicates a current clock cycle. The latch portion includes invertor gate 210 and P-channel transistor 212 driven by the clock signal on line 102. In order to create static latches, suitable for operating environments having high radiation levels, invertor gate 210 is provided with an inverted return loop formed with invertor 216 that refreshes the input of invertor 210 and thereby statically latches the input value.

The next bit generation portion includes invertor gate 218, static latch 209 and static latch 211 connected in a loop with lines 222, 224 and 226 to form an unstable circuit. The circuit is synchronized and made bi-stable with the clock signal on line 102. Static latch 209 includes invertor gate 208 and transmission gate 230. The transmission gate 230 is an N-channel transistor driven by the clock signal on its gate input. The transmission gate is "opened" by the clock signal on line 102 going to a logic high level. The opening of the transmission gate drives the input to the invertor 208 to the logic level carried by line 226 from the output of static latch 211. To refresh the input of the invertor 208, an inverted return loop from its output is provided with invertor gate 214.

Latch circuit 211 is similarly constructed, using invertor 220, an inverted return loop with invertor gate 234, but using instead an P-channel transistor for a transmission gate 228. The P-channel transistor opens the transmission gate when the clock signal goes to a logic low level.

The value on the output on static latch 211 is clocked into static latch 209 during the first half clock cycle, and the inverted output of static latch 209 is clocked into static latch 211 during the second half of the clock cycle. This creates on line 226 a binary value of $B_0$ that oscillates between "0" and "1" logic levels at a rate that is one-half of the clock frequency. The transition detection portion 204 of the circuit of cell 200 includes NOR gate 232. NOR gate 232 receives on its input the previous bit value $(B_0)^{v-1}$ from the output of static latch 202. The second input of NOR gate 232 is the input of invertor gate 220, of latch 211 which is a current bit value $(B_0)^v$ inverted. The output of the NOR gate 232 on line 234 is consequently always "0" unless the previous bit value is "0" and the current bit value is "1", indicating a "0" to "1" transition. The output of the NOR gate is the (01) signal that is provided to the next higher order counter cell.

Figure 3:
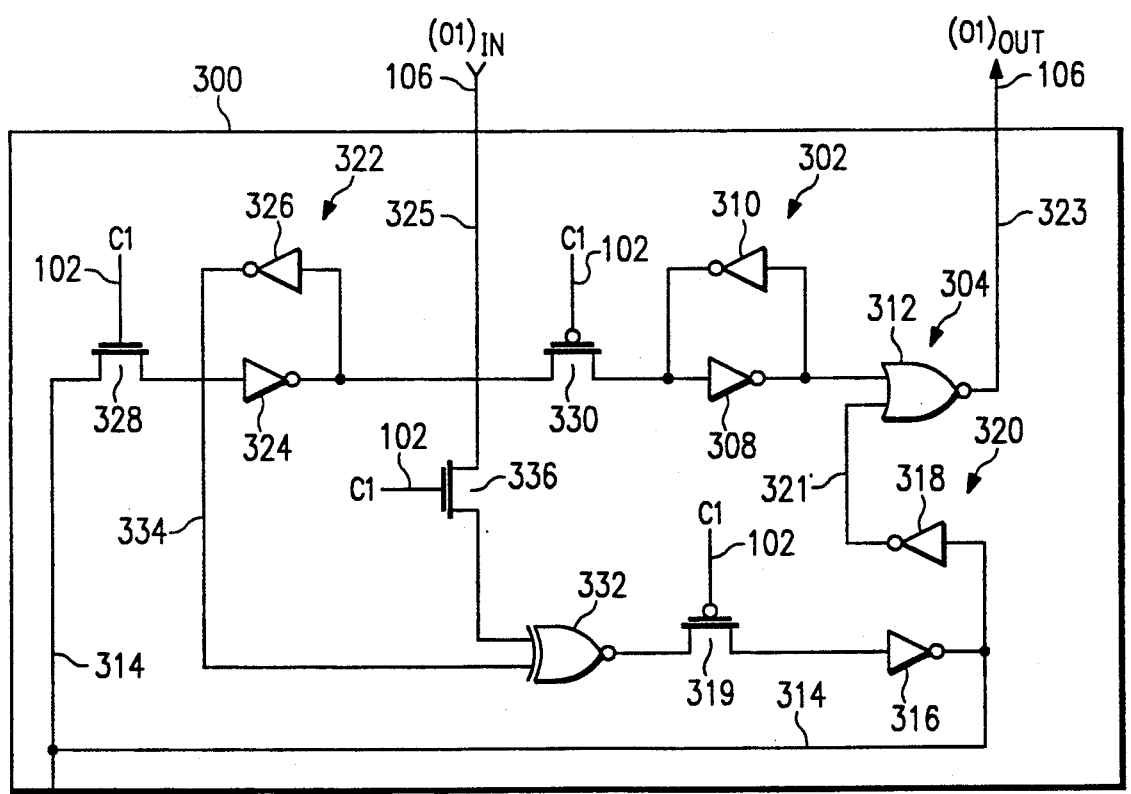
FIG. 3 is a gate-level schematic diagram of a standard $B_i$ counter cell.

FIG. 3 shows a schematic at gate level of a circuit for a counter cell 300, used for all bits $B_i$ for $i=1$ to $I-1$. Counter cell 300 includes the same basic constituent portions as does counter cell 200, namely a latch portion 302 for remembering the previous bit value of the cell, a transition detection portion 304 for detecting transitions from "0" to "1" between successive clock periods and a next bit value generation portion.

The bit value at the previous clock cycle $(B_i)^{v-1}$ is stored by an inverting static latch 302. The static latch is formed from invertor 308, transmission gate 330 and an inverted return loop formed with invertor 310. Transmission gate 330 is a P-channel transistor driven by the clock signal on line 102. The transmission gate clocks in during the second half of the current clock cycle v the inverse value of the bit determined during the previous clock cycle $v-1$, $(B_i)^{v-1}$, stored by static latch 322. Static latch 322 includes invertor 324, a return loop with invertor 326 and N-channel transmission gate 328 driven by the clock signal on line 102.

The output of the static latch 302 $(B_i)^{v-1}$ is provided to one input of NOR gate 312. NOR gate 312 is part of transition detection portion 304 of the counter cell. The inverse of the current bit value $(B_i)^v$ during the second half of the current clock cycle is taken from the input to invertor 316 and provided on line 321 to the second input on NOR gate 312. When both inputs to NOR gate 312 are "0", it indicates that a "0" to "1" transition has occurred between the previous bit value and the current bit value, and the output of NOR gate 312 goes to a logic "1". Otherwise, the output remains at a logic "0". The output of NOR gate 323 is provided as a $(01)_{out}$ signal on line 323.

The next bit generation portion of the counter cell 300 includes an inverting static latch 320 that is coupled by lines 314 and 334 in a loop with the exclusive NOR (NEXOR) gate 332. Static latch 320 includes invertor 316, return loop with invertor 318 and P-channel transistor transmission gate 319 driven by the clock signal on line 102.

During the first half of a clock period, static latch 322 clocks in the value of $B_i$ on line 314 and latches its inverse value. This inverted value of $B_i$ is provided to inverse static latch portion 302 during the second half of a clock period. Line 334 carries to an input of NEXOR gate 332 the input to static latch 322, namely $B_i^v$, one half clock period after $B_i^v$ appears on line 314 as the output of static latch 320. Static latch 320 clocks in the value on the output of NEXOR gate 332 during the second half of a clock period, and latches its inverted value on line 314 as the current bit value.

The stability of the loop formed by static latch 320 and NEXOR gate 332 depends on whether the NEXOR gate 332 acts as an invertor or a buffer for the value on line 334. If it simply buffers the value, there is an odd number of invertors in the loop and the loop is unstable, causing the value of $B_i$ on line 314 to toggle. If it acts as an invertor, there are an even number of invertors that create a stable loop and therefore the value of $B_i$ on line 314 remains unchanged.

Whether the NEXOR gate acts as a buffer or an invertor depends on a $(01)_{in}$ signal on line 325 received from a next lower order bit. Transmission gate 336, an N-channel transistor, clocks in the $(01)_{in}$ signal to one input of NEXOR gate 332 during the first half of the clock period, at the same time transmission gate 328 clocks in the value of $B_i$ via line 334 into the other input of NEXOR gate 332. If the $(01)_{in}$ input is "1", the NEXOR gate functions as a buffer and its output will equal the current bit value $(B_i)^v$, causing inverting static latch 320 to latch the inverted value of the previous bit as the new bit value $(B_i)^{v+1}$. Otherwise, if the $(01)_{in}$ input is "0", the NEXOR gate will act as an inverter and its output will assume the value opposite of the previous bit value $(B_i)^v$, causing the inverting latch 320 to latch as $(B_i)^{v+1}$ the same value as $(B_i)^v$.

FIG. 4 illustrates a computer simulated response of each counter cell of a five bit counter to a one hundred megahertz clock in a voltage verses time diagram. Voltage versus time trace 402 is that of the clock signal. Traces 404 to 412 are the $B_i$ outputs of each counter cell i, i=0 to 4, where counter cell 0 is a counter cell 200 that functions according to the logic level schematic of FIG. 2, and the remaining counter cells are counter cells 300 that function according to the logic level schematic in FIG. 3. Note that the clock must complete one cycle before bit $B_0$ will change value. Likewise, each subsequent bit value changes state when the next lower order bit completes one cycle. The high frequency counting technique of the present invention is implemented in one preferred embodiment using CMOS technology and designed for operation in an environment with high radiation levels. If 1.2 μm CMOS technology is used the operating speed for the circuit is around 300 MHz. If dynamic operation of the latching circuits is allowed and if CMOS transmission gates are introduced the speed of the counter can easily be increased to 0.5 GHz. This is independent of the number of bits in the counter.

Referring now to Table 1 below, the output of the counter in its preferred embodiment is termed "edge triggered code". The relationship between this code through the first four bits and standard binary code and decimal code for four bits is shown by Table 1.

TABLE 1

| | Edged Triggered Code | | | | Binary | | | |
|---|---|---|---|---|---|---|---|---|
| DEC | bit 3 | bit 2 | bit 1 | bit 0 | bit 3 | bit 2 | bit 1 | bit 0 |
| 0 | 0 | 0 | 0 | 0 | 0 | 0 | 0 | 0 |
| 1 | 0 | 0 | 0 | 1 | 0 | 0 | 0 | 1 |
| 2 | 0 | 0 | 1 | 0 | 0 | 0 | 1 | 0 |
| 3 | 0 | 1 | 1 | 1 | 0 | 0 | 1 | 1 |
| 4 | 1 | 1 | 0 | 0 | 0 | 1 | 0 | 0 |
| 5 | 1 | 1 | 0 | 1 | 0 | 1 | 0 | 1 |
| 6 | 1 | 1 | 1 | 0 | 0 | 1 | 1 | 0 |
| 7 | 1 | 0 | 1 | 1 | 0 | 1 | 1 | 1 |
| 8 | 1 | 0 | 0 | 0 | 1 | 0 | 0 | 0 |
| 9 | 1 | 0 | 0 | 1 | 1 | 0 | 0 | 1 |
| 10 | 1 | 0 | 1 | 0 | 1 | 0 | 1 | 0 |
| 11 | 1 | 1 | 1 | 1 | 1 | 0 | 1 | 1 |
| 12 | 0 | 1 | 0 | 0 | 1 | 1 | 0 | 0 |
| 13 | 0 | 1 | 0 | 1 | 1 | 1 | 0 | 1 |
| 14 | 0 | 1 | 1 | 0 | 1 | 1 | 1 | 0 |
| 15 | 0 | 0 | 1 | 1 | 1 | 1 | 1 | 1 |

The edge triggered code may be used directly by circuits designed to recognize the code. It may also be transformed using dedicated or programmable circuits to any type of code required by the system in which the counter is placed. To transform edge triggered code to binary code, for example, each column i in the edge triggered code columns of Table 1 is separately rotated downward $2^i-(i+1)$ places, which is equivalent to adding this value to the decimal value. For example, binary code is obtained by downwardly rotating the ETC column of bit 0 by $2^0-(0+1)$ or zero places; rotating the ETC column of bit 1 downwardly by $2^1-(1+1)$ or zero places; rotating the ETC column of bit 2 downwardly by $2^2-(2+1)$ or one place; and rotating the ETC column of bit 3 by $2^3-(3+1)$ or 4 places.

To convert from decimal to edge triggered code, note first that for conversion of decimal to binary code the value of bit i is found by an integer division of the decimal number by $2^i$. For example, binary bit 2 in the representation of the decimal number 7 is given by $7/2^2=1$. If the resulting number for a given bit is even, the binary bit is 0; if it is odd the binary bit is 1.

As previously discussed, the binary equivalent of a single bit at position i in the ETC code is obtained after a rotation by $2^i-(i+1)$ places, which is equivalent to adding this number to the decimal value. Therefore, the value of a bit in the ETC code is obtained by applying integer division by $2^i$ on the resulting number. In other words, for a decimal number N, each bit i of the ETC code is determined by using the formula $(N+2^i-(i+1))/2^i$ using integer division. If the resulting number for a given bit is even, then the ETC bit is 0; if it is odd then the ETC bit is 1.

For example, the four bit ETC equivalent of the decimal number 12 is found as follows:

bit 0: $(12+2^0-(0+1))/2^0=12$ (even)→0 bit 1: $(12+2^1-(1+1))/2^1=6$ (even)→0 bit 2: $(12+2^2-(2+1))/2^2=3$ (odd)→1 bit 3: $(12+2^3-(3+1))/2^3=2$ (even)→0

Although preferred embodiments of the invention have been described in the foregoing detailed description and illustrated in the accompanying drawings, it will be understood that the invention is not limited to the embodiments disclosed but is capable of numerous rearrangements, modifications, and substitutions of parts and elements without departing from the spirit of the invention. Accordingly, the present invention is intended to encompass such rearrangements, modifications, and substitutions of parts and elements as fall within the scope of the invention.

I claim:

1. A counter in which enable signals are known one clock period ahead and there is no carry propagation, comprising a plurality of bit counting cells coupled serially from a lowest order bit counting cell to a highest order bit counting cell; each cell having two possible states, each state representing one of two possible bit values; each higher order bit counting cell changing states during a current clock period depending solely on a transition in state of a next lower order bit counting cell during a previous clock period.

2. The counter of claim 1 wherein the lowest order bit counting cell changes state based solely on a clock.

3. The counter of claim 1 wherein each bit counting cell of the plurality of cells produces a transition signal during a current clock period indicating a transition in a state of the bit counting cell between the previous clock period and the current clock period, the transition signal being provided to a next highest order bit counter cell for use in determining whether to change state in a next clock period.

4. The counter of claim 1 wherein the transition in the state of the next lower order bit cell is a transition from logical "0" to logical "1" in the bit value represented by the state of the bit counting cell.

5. A counter for high speed counting in which enable signals are known one clock period ahead of a bit change, comprising a plurality of cells, at least one cell including:
   means for storing a current bit value for a current clock period;
   means for determining a new bit value for a new clock period responsive to means for storing a current bit value; and
   means for indicating an occurrence of a transition between a previous value and a current value of a lower order bit in a next lower order bit counter cell;
   the means for storing a current bit value changing the current bit value during the new clock period only if there is a transition in the next lower order bit value during a preceding clock period.

6. The counter of claim 5 wherein the at least one cell further includes:
   means for storing a previous bit value from a previous clock period;
   means for detecting a transition between the previous bit value and the current bit value during a current clock period; and
   means for indicating to a next higher order bit counter cell an occurrence of a transition between the previous bit value and the current bit value, the means for indicating coupled to a next higher order bit counter cell.

7. The counter of claim 6 further comprising a counter cell for a lowest order bit, the counter cell including:
   means for storing a current bit value;
   means for changing the current bit value at a clock rate;
   means for indicating a transition between a previous bit value and a current bit, the means for indicating coupled to a next higher order bit cell.

8. A method of operating a counter wherein an enable signal is known one clock period in advance of a bit change, the counter having a plurality of counter cells coupled serially from a lowest order bit to a highest order bit, each cell counting one bit in a multi-bit word, comprising the steps of:
   changing a lowest order bit value in a first counter cell in response to a clock rate;
   changing a first next higher order bit value in a second counter cell one clock period following a transition in the value of the lowest order bit and solely in response to said transition in the value of the lowest order bit; and
   changing a second next higher order bit value in a third counter cell one clock period following a transition in the first next higher order bit and solely in response to said transition in the first next higher order bit.

9. The method of claim 8 further including the step of detecting a transition in the first next higher order bit value in the second counter cell and providing a signal to the third counter cell indicating the transition to the third counter cell in advance of the next clock period.

10. The method of claim 8 wherein the transition is a transition from a logical "0" to a logical "1".

UNITED STATES PATENT AND TRADEMARK OFFICE
CERTIFICATE OF CORRECTION

PATENT NO. : 5,224,133
DATED : June 29, 1993
INVENTOR(S) : Guy F. Vanstraelen

It is certified that error appears in the above-indentified patent and that said Letters Patent is hereby corrected as shown below:

Col. 1, line 65 [specification page 2, line 17], "increase" should be --increases--.

Col. 2, line 2 [specification page 3, line 3], "flop" should be --flops--.

Col. 2, line 3 [specification page 3, line 3], "flop" should be --flops--.

Col. 6, line 22 [amendment filed 01/07/93 page 2, line 10] "verses" should be --versus--.

Signed and Sealed this

Twenty-fifth Day of January, 1994

Attest:

BRUCE LEHMAN

*Attesting Officer*  *Commissioner of Patents and Trademarks*